United States Patent
Choo et al.

(10) Patent No.: US 11,367,214 B2
(45) Date of Patent: Jun. 21, 2022

(54) APPARATUS FOR DETERMINING ARRANGEMENT OF OBJECTS IN SPACE AND METHOD THEREOF

(71) Applicant: SAMSUNG SDS CO., LTD., Seoul (KR)

(72) Inventors: Jin Ho Choo, Seoul (KR); Il Joo Yoon, Seoul (KR); Yeong Dae Kwon, Seoul (KR); Uk Jo, Seoul (KR); Seong Su Kim, Seoul (KR); Jeong Hoe Goo, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 161 days.

(21) Appl. No.: 16/885,544

(22) Filed: May 28, 2020

(65) Prior Publication Data
US 2021/0350569 A1 Nov. 11, 2021

(30) Foreign Application Priority Data

May 8, 2020 (KR) .......................... 10-2020-0055084

(51) Int. Cl.
*G06T 7/73* (2017.01)
*G06K 9/62* (2022.01)

(52) U.S. Cl.
CPC ............. *G06T 7/73* (2017.01); *G06K 9/6262* (2013.01); *G06T 2207/20021* (2013.01); *G06T 2207/20081* (2013.01); *G06T 2207/20084* (2013.01)

(58) Field of Classification Search
CPC ............. G06T 7/73; G06T 2207/20021; G06T 2207/20081; G06T 2207/20084;

(Continued)

(56) References Cited

U.S. PATENT DOCUMENTS

2003/0110102 A1* 6/2003 Chien .................... G06Q 10/08
705/28
2015/0130592 A1* 5/2015 Lakshminarayanan ......................
G06K 7/10297
340/10.1

(Continued)

FOREIGN PATENT DOCUMENTS

KR 10-2001318 B1 7/2019

OTHER PUBLICATIONS

European Search Report For EP 20199790.5 dated Mar. 25, 2021 from European patent office in a counterpart European patent application.

(Continued)

*Primary Examiner* — Bobbak Safaipour
(74) *Attorney, Agent, or Firm* — The PL Law Group, PLLC

(57) ABSTRACT

A method of embedding a vector representing an arrangement state of objects in a 3D space according to an embodiment includes dividing a target space into M×N subspaces extending from a first surface among planes forming the target space having a cuboid shape, calculating, for each of the subspaces, a feature representing an object arrangement state in the subspace, inputting data representing the feature of each of the subspaces into an artificial neural network and obtaining, from the artificial neural network, an embedding vector representing an arrangement state of an object in the target space.

19 Claims, 17 Drawing Sheets

(58) Field of Classification Search
CPC ............ G06T 2219/2004; G06T 19/20; G06K
9/6262; G06F 17/11; G06F 30/10; G06F
30/27; G06Q 10/083; G06Q 10/04; G06N
3/0445; G06N 3/0454
See application file for complete search history.

(56) References Cited

U.S. PATENT DOCUMENTS

| | | | | |
|---|---|---|---|---|
| 2020/0283245 | A1* | 9/2020 | Gualtieri | G09B 9/00 |
| 2021/0179356 | A1* | 6/2021 | Chen | G06T 7/62 |
| 2021/0350569 | A1* | 11/2021 | Choo | G06T 19/20 |
| 2021/0395007 | A1* | 12/2021 | Galluzzo | B65G 1/1371 |

OTHER PUBLICATIONS

Haoyuan Hu et al., "Solving a New 3D Bin Packing Problem with Deep Reinforcement Learning Method", arXiv.org, Aug. 20, 2017, Online Cornell University Library.

Haoyuan Hu et al., "A Multi-task Selected Learning Approach for Solving New Type 3D Bin Packing Problem", arXiv.org, Apr. 17, 2018, Online Cornell University Library.

Lu Duan et al., "A Multi-task Selected Learning Approach for Solving 3D Flexible Bin Packing Problem", arXiv.org, Feb. 15, 2019, Online Cornell University Library.

Kundu Olyvia et al., "Deep-Pack: A Vision-Based 2D Online Bin Packing Algorithm with Deep Reinforcement Learning", 2019 28th IEEE International Conference on Robot and Human Interactive Communication (RO-MAN), Oct. 14, 2019, pp. 1-7, IEEE.

* cited by examiner

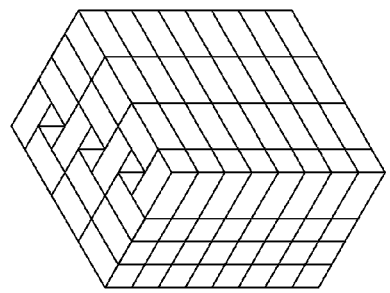
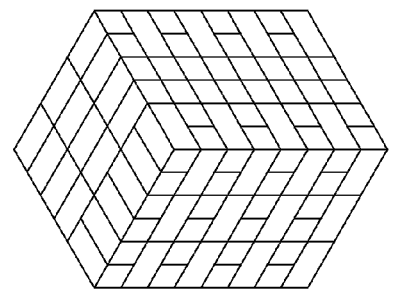
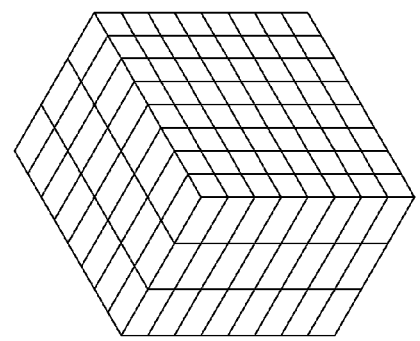
Fig. 14

APPARATUS FOR DETERMINING ARRANGEMENT OF OBJECTS IN SPACE AND METHOD THEREOF

CROSS REFERENCE TO RELATED APPLICATIONS AND CLAIM OF PRIORITY

This application claims the benefit of Korean Patent Application No. 10-2020-0055084 filed on May 8, 2020 in the Korean Intellectual Property Office, the disclosure of which is incorporated herein by reference in its entirety.

1. FIELD

The present invention relates to an apparatus and method for determining the arrangement of objects in space. More specifically, it relates to an apparatus and method for determining a method of efficiently arranging objects having different properties in a given space using a neural network based model.

2. DESCRIPTION OF THE RELATED ART

Various methods of solving the bin packing problem of efficiently arranging cargo in a target space such as a container or a pallet are widely used in industrial fields such as logistics and delivery. Specifically, when information about a certain size of a target space (container and pallet, etc.) and a plurality of arrangement target objects of various sizes are given, various heuristic-based algorithms are used in order to arrange the given objects in the given target space in the most space efficient and stable manner, considering properties such as size and weight of the target objects. For example, approaches have been used to find a solution approximate to the optimal solution using algorithms such as First Fit Decreasing algorithm, Best Fit algorithm, Worst Fit algorithm, and Next Fit algorithm.

Recently, approaches to solve the bin packing problem using machine learning have been attempted. For example, after learning an artificial neural network using a result of arranging a given space and a given object and an evaluation value thereof, information on the space and objects in a new condition is input into the artificial neural network to obtain the final result of arranging the objects in the target space from an artificial neural network.

However, an efficient method for embedding information representing the state, in which objects are arranged in the target space, into a vector having a form suitable for processing by an artificial neural network is not provided. In other words, a method of embedding a vector that adequately and sufficiently expresses the arrangements of objects in the target space, is not provided. Further, a method for configuring an optimal structure of a neural network that embeds information on the arrangement state of objects into a vector and a neural network that determines the arrangement of objects, and efficiently learning them is not provided. On the other hand, new evaluation criteria for the final arrangement result of objects, which cannot be considered in heuristic based bin packing algorithms, but can be considered in the method based on machine learning, need to be presented.

SUMMARY

The technical problem to be solved by some embodiments of the present invention is to provide an apparatus and method for determining a method of efficiently arranging a plurality of objects in a target space using a neural network based model.

Another technical problem to be solved by some embodiments of the present invention is to provide an efficient method and apparatus for embedding various information representing an arrangement state of objects in a target space into a vector that an artificial neural network can process.

Another technical problem to be solved by some embodiments of the present invention is to provide a method and apparatus for configuring and effectively learning a neural network that embeds information on the arrangement state of objects into vector information and a neural network that determines the arrangement of objects.

Another technical problem to be solved by some embodiments of the present invention is to provide a method and apparatus for evaluating a final arrangement result, which can be used in a process of learning an artificial neural network that efficiently arranges a plurality of objects in a target space.

According to the present disclosure, a method of embedding a vector representing an arrangement state of objects in a 3D space is provided. The method may include dividing a target space into M×N subspaces extending from a first surface among planes forming the target space having a cuboid shape, calculating, for each of the subspaces, a feature representing an object arrangement state in the subspace, inputting data representing the feature of each of the subspaces into an artificial neural network, and obtaining, from the artificial neural network, an embedding vector representing an arrangement state of an object in the target space.

According to an embodiment, dividing the target space into M×N subspaces extending from the first surface may include, dividing the first plane into M×N subplans, and identifying each space between an opposing surface of the first surface and the M×N subplanes as M×N subspaces extending from the first surface.

According to an embodiment, the first surface may be a bottom surface of the target space, and a feature representing an object arrangement state in the subspace may represent an occupancy state of each of the subspaces.

According to an embodiment, the occupancy state of each of the subspaces may include at least one of a size of space occupied with the object in each of the subspaces, a size of space not occupied with the object in each of the subspaces, a ratio of the space not occupied with the object compared to the space occupied with the object, a number of spaces not occupied with the object in each of the subspaces, a height of a top surface of the object arranged in each of the subspaces, and a size of space above a top surface of the object arranged in each of the subspaces.

According to an embodiment, the first surface may be a bottom surface of the target space, and a feature representing an object arrangement state in the subspace may include a state regarding weight of each of the subspaces.

According to an embodiment, the state regarding weight of each of the subspaces may include at least one of a weight of the object arranged in each of the subspaces and a weight that can be added to each of the subspaces.

According to an embodiment, the first surface may be a bottom surface of the target space, and a feature representing an object arrangement state in the subspace may include a difference between a height of a top surface of the object arranged in each of the subspaces and a height of a top surface of the object arranged in an adjacent subspace of each of the subspaces.

According to an embodiment, the method may further include dividing the target space into P×Q subspaces extending from a second surface orthogonal to the first surface among planes forming the target space, wherein calculating a feature representing a state of an object arranged in the subspace may include calculating a feature for each of subspaces extending from the second surface, wherein inputting data representing the feature into an artificial neural network may include inputting data representing a feature of each of the subspaces extending from the second surface into the artificial neural network.

According to an embodiment, the second surface may be a front or side surface of the target space, and a feature for each of subspaces extending from the second surface may include whether an identifier of the object displayed on a surface of an object arranged in each of the subspaces extending from the second surface is visible from the second surface.

According to the present disclosure, a method of arranging an object in a 3D space is provided. The method may include obtaining information on a target space and a plurality of objects to be arranged in the target space, calculating a feature representing an arrangement state of each of a plurality of subspaces constituting the target space from information on an arrangement state of objects existing in the target space, obtaining an arrangement state embedding vector of the target space based on data representing the feature of each of the plurality of subspaces, and selecting, based on information on the target space, information on the plurality of objects and the embedding vector, a first object to be arranged in the target space among the plurality of objects and determining a position where the first object will be arranged in the target space.

According to an embodiment, information on the target space and the plurality of objects may include information on a size of the target space and information on a size of each of the plurality of objects.

According to an embodiment, information on the target space and the plurality of objects may further include information on a weight that can be supported by a bottom surface of the target space and information on a weight of each of the plurality of objects.

According to an embodiment, obtaining the embedding vector may include inputting data representing the feature of each of the subspaces into a first artificial neural network, and obtaining the embedding vector from the first artificial neural network.

According to an embodiment, selecting a first object to be arranged in the target space among the plurality of objects and determining a position where the first object will be arranged in the target space may include inputting information on the plurality of objects and the embedding vector into a second artificial neural network.

According to an embodiment, the first artificial neural network and the second artificial neural network may be learned together in a single learning process.

According to the present disclosure, am apparatus for determining an arrangement of an object in a 3D space is provided. The apparatus may include an input unit for obtaining information on a target space and a plurality of objects to be arranged in the target space, an embedding unit for obtaining an arrangement state embedding vector of the target space from information on arrangement state of objects existing in the target space, a determining unit for selecting a first object to be arranged in the target space among the plurality of objects and determining a position where the first object will be arranged in the target space based on information on the target space, information on the plurality of objects and the embedding vector, and an arrangement state update unit for updating information on an arrangement state of objects existing in the target space.

According to an embodiment, the embedding unit may include a feature map generating unit and a feature map vectorization unit, wherein the feature map generating unit may generate a feature map representing a feature representing an object arrangement state in the subspace for each of the plurality of subspaces, into which the target space is divided, wherein the feature map vectorization unit may input the feature map into a first artificial neural network and obtains the embedding vector from the first artificial neural network, According to an embodiment, the determining unit may input information on the plurality of objects and the embedding vector into a second artificial neural network and obtains a position where the first object will be arranged from the second artificial neural network.

According to an embodiment, the apparatus may further include an arrangement result evaluating unit and learning unit, wherein the arrangement result evaluating unit may generate an evaluation result for a result that the plurality of objects are arranged in the target space, wherein the learning unit may update parameters of the first artificial neural network and the second artificial neural network based on the evaluation result.

According to an embodiment, the evaluation result may include a ratio that the target space is filled, the sum of the surface areas of the objects arranged in the target space, a pattern made by the plurality of objects arranged in the target space, whether an identifier for each of the objects displayed on a part of a surface of each of the plurality of objects is visible, and a position of a center of gravity of the target space filled with the plurality of objects.

According to the present disclosure, a method of embedding a vector representing an arrangement state of objects in a 3D space is provided. The method may include calculating, for each of a plurality of subspaces, into which the target space is divided, a feature representing an object arrangement state in the subspace, inputting a feature of each of the plurality of subspaces into an artificial neural network, and obtaining an embedding vector representing an arrangement state of an object in the target space from the artificial neural network.

BRIEF DESCRIPTION OF THE DRAWINGS

FIG. 14 is a diagram exemplarily showing arrangement state patterns that can be referred to in the arrangement result evaluating unit of the object arrangement determining apparatus described with reference to FIG. 2.

DETAILED DESCRIPTION

Figure 1:
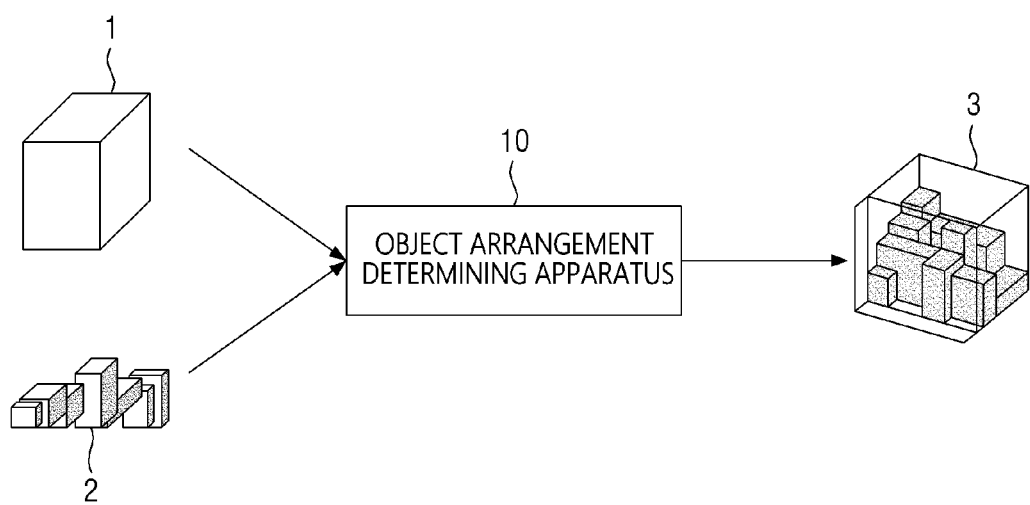
FIG. 1 is a diagram for describing the input and output of the object arrangement determining apparatus according to an embodiment of the present invention.

Hereinafter, preferred embodiments of the present disclosure will be described with reference to the attached drawings. Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims.

In adding reference numerals to the components of each drawing, it should be noted that the same reference numerals are assigned to the same components as much as possible even though they are shown in different drawings. In addition, in describing the present invention, when it is determined that the detailed description of the related well-known configuration or function may obscure the gist of the present invention, the detailed description thereof will be omitted.

Unless otherwise defined, all terms used in the present specification (including technical and scientific terms) may be used in a sense that can be commonly understood by those skilled in the art. In addition, the terms defined in the commonly used dictionaries are not ideally or excessively interpreted unless they are specifically defined clearly. The terminology used herein is for the purpose of describing particular embodiments only and is not intended to be limiting of the invention. In this specification, the singular also includes the plural unless specifically stated otherwise in the phrase.

In addition, in describing the component of this invention, terms, such as first, second, A, B, (a), (b), can be used. These terms are only for distinguishing the components from other components, and the nature or order of the components is not limited by the terms. If a component is described as being "connected," "coupled" or "contacted" to another component, that component may be directly connected to or contacted with that other component, but it should be understood that another component also may be "connected," "coupled" or "contacted" between each component.

Hereinafter, some embodiments of the present invention will be described in detail with reference to the accompanying drawings.

FIG. 1 is a diagram for describing the input and output of the object arrangement determining apparatus 10 according to an embodiment of the present invention.

As shown in FIG. 1, the object arrangement determining apparatus 10 is a computing device that receives information 1 on a target space and information 2 on a plurality of arrangement target objects as input, and outputs the result 3 that a plurality of objects are arranged in the target space.

The computing device may be a laptop, desktop, laptop, etc., but is not limited thereto, and may include all types of devices equipped with computing functions. An example of the computing device will be further referred to FIG. 17.

Although FIG. 1 illustrates an example, in which the object arrangement determining apparatus 10 is implemented as a single computing device, the first function of the object arrangement determining apparatus 10 may be implemented in the first computing device and the second function may be implemented in the second computing device.

According to various embodiments of the present invention, the object arrangement determining apparatus 10 may generate the arrangement result 3 of objects from the information 1 on the target space and the information 2 on the plurality of arrangement target objects.

Information on the target space 1 may include information on the shape of the target space, information on the size of the target space and information on a weight that the target space or the bottom, front, back, side, and/or top surfaces of the target space can support.

The information 2 on the arrangement target objects includes information on the shape of each object, information on the size of each object, information on the weight of each object and information on the weight that each object can support.

The result of arranging objects 3 is information including a position, an order, in which a plurality of arrangement target objects are arranged in a target space, and distribution of loads accordingly.

The object arrangement determining apparatus 10 may generate an object arrangement result 3 from the information 1 on the target space and the information 2 on the plurality of arrangement target objects using the artificial neural network based model.

Figure 2:
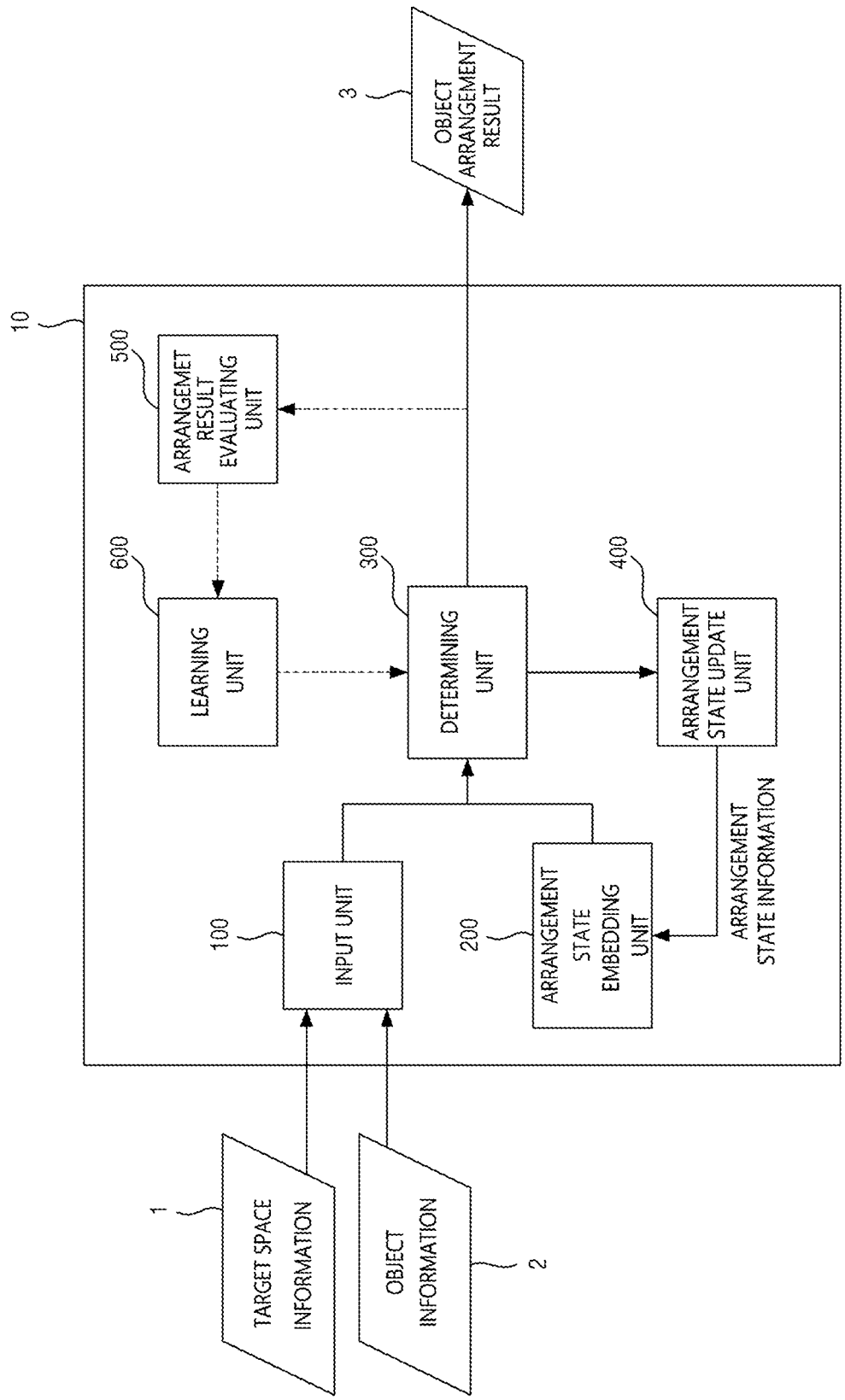
FIG. 2 is a block diagram of an object arrangement determining apparatus described with reference to FIG. 1.

Hereinafter, the configuration and operation of the object arrangement determining apparatus 10 according to an embodiment of the present invention will be described with reference to FIG. 2. As shown in FIG. 2, the object arrangement determining apparatus 10 according to the present embodiment may include an input unit 100, an arrangement state embedding unit 200, a determining unit 300, and an arrangement state update unit 400.

In some embodiments, the object arrangement determining apparatus 10 may further include an arrangement result evaluating unit 500 and a learning unit 600. However, only components related to the embodiment of the present invention are illustrated in FIG. 2. Therefore, those skilled in the art to which the present invention pertains can understand that other general purpose components may be further included in addition to the components shown in FIG. 2. Also, it is noted that each component of the object arrangement determining apparatus 10 shown in FIG. 2 refers to functionally divided functional elements, and a plurality of components may be implemented in an integrated form in an actual physical environment. Hereinafter, each component will be described.

The input unit 100 receives information 1 on a target space where a plurality of objects will be placed and information 2 on a plurality of objects as input. As described above, the information 1 on the target space may include information on the shape, size of the target space and weight that the target space can support. The information 2 on the arrangement target objects may include information on the shape, size, weight of each object, and weight that the object can support (e.g., weight of other objects that can be arranged on top of the object). The input unit 100 obtains the information as an input value and provides it to the determining unit 300. In some embodiments, the input unit 100 may embed information 1 on the target space and information 2 on the objects into one or more vectors to provide as some of the input values of the determining unit 300. At this time, in the process of embedding the information on the target space 1 and the information on the target objects 2 into a vector, various conventionally known vector embedding techniques can be used, and the present invention is not limited to use any one of the embedding methods.

The arrangement state embedding unit 200 receives information on the arrangement state of objects existing in the target space as input, and embeds it into a vector representing the object arrangement state in the target space. The arrangement state embedding unit 200 provides the arrangement state embedding vector to the determining unit 300. The arrangement state embedding unit 200 will be described in more detail with reference to FIGS. 3 to 11.

The determining unit 300 receives one or more embedding vectors representing information 1 on the target space and information 2 on the plurality of target objects to be arranged in the target space from the input unit 100 as input, and receives the current object arrangement state embedding vector of the target space as input from the arrangement state embedding unit 200. The determining unit 300 inputs at least some of the embedding vectors into an object arrangement determination model, and obtains a state, in which at least one object is additionally arranged in a target space, from the model. The determining unit 300 provides a result of additionally arranging at least one object in the target space to the arrangement state update unit 400, and outputs the final arrangement result if the arrangement of all possible objects is completed.

The determining unit 300 may include, for example, an object arrangement determination model based on an artificial neural network. For example, a model such as Deep Neural Network (DNN), Linear Neural Network, Recurrent Neural Network (RNN), Long Short-Term Memory (LSTM), Convolutional Neural Network (CNN) and a fully connected layer or a neural network model configured by combining them may be used as an object arrangement determination model, but the present invention is not limited thereto.

The object arrangement determination model can be learned, based on a result of arranging a given space and a given object and an evaluation result thereof, through various reinforcement learning methods such as supervised learning or policy gradient.

The determining unit 300 will be described later with reference to FIG. 12.

The arrangement state update unit 400 updates the arrangement state information 5 of the target space by reflecting the result of additionally arranging the at least one object from the determining unit 300. The arrangement state update unit 400 provides the updated arrangement state information 5 to the arrangement state embedding unit 200.

The arrangement result evaluating unit 500 receives the result that the arrangement of all objects in the target space is completed as input, and determines evaluation (or reward) for the arrangement result. The evaluation result may be used for learning the object arrangement determination model in the determining unit 300.

Specifically, the evaluation result determined by the arrangement result evaluating unit 500 may be provided to the learning unit 600, and the learning unit 600 may use the evaluation result to update the parameters of the artificial neural network configuring the object arrangement determination model. As will be described later, in some embodiments, the learning unit 600 updates the parameters of an artificial neural network constituting the object arrangement determination model in the determining unit 300 as well as the parameters of an artificial neural network constituting the feature map vectorization unit 220 in the arrangement state embedding unit 200. This will be described later with reference to FIG. 13.

Next, the operation of the object arrangement determining apparatus 10 according to the present embodiment will be described.

First, information on a target space and a plurality of objects is obtained by the input unit 100 and is embedding vectorized, and an embedding vector representing the arrangement state of objects existing in the target space is obtained by the arrangement state embedding unit 200. Subsequently, at least one object to be arranged in the target space is selected by the determining unit 300 based on the embedding vectors, and an arrangement position of the at least one object is determined. The arrangement state information of objects existing in the target space is updated by the arrangement state update unit 400. If all of the plurality of objects are not arranged in the target space, another arrangement target object is selected by the determining unit 300 and its arrangement position is determined. The above operations are repeated until a plurality of objects are all arranged in the target space or there are no more objects that can be arranged in the target space.

When the arrangement of the objects is completed, the evaluating unit 500 determines the evaluation (or reward) for the result that the arrangement of the objects in the target space is completed, and based on this, the artificial neural network constituting the object arrangement determining apparatus may be updated by the learning unit 600.

Hereinafter, the arrangement state embedding unit 200 will be described in more detail with reference to FIGS. 3 to 11.

Figure 3:
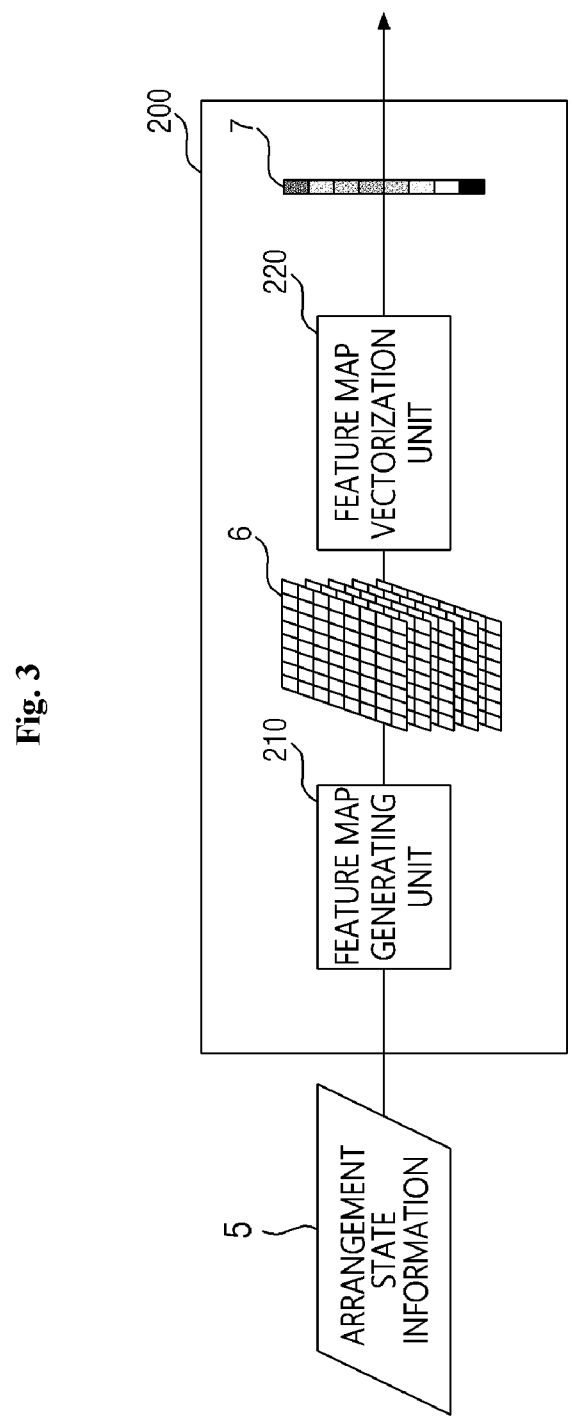
FIG. 3 is a diagram for describing an arrangement state embedding unit of the object arrangement determining apparatus described with reference to FIG. 2.

As described above, the arrangement state embedding unit 200 receives the information 5 on the arrangement state of objects existing in the target space as input, and generates the arrangement state embedding vector 7 representing the arrangement state of the objects. Referring to FIG. 3, the arrangement state embedding unit 200 may include a feature map generating unit 210 and a feature map vectorization unit 220.

The feature map generating unit 210 generates a feature map representing features related to an object arrangement state in the subspace for each of the plurality of subspaces constituting the target space. It will be described in more detail with reference to FIG. 4.

The feature map generating unit 210 may divide the lower surface, that is, the bottom surface, among six planes forming, for example, a target space 41 having a cuboid shape into M×N subplanes, and identify the M×N subspaces extending from each of M×N subplanes. That is, the target space may be divided into M×N subspaces having a square pillar shape. At this time, a sufficiently large number of M and N is used. The square pillar 43 of FIG. 4 represents any one of the M×N subspaces.

The feature map generating unit 210 generates feature maps 45a to 45l by calculating various features representing an object arrangement state in each subspace for each of M×N subspaces. Here, the feature is a size of a space filled with objects in each subspace, a size of a space not filled with objects in each subspace, and a sum of weights of objects arranged in each subspace. Various features calculated by the feature map generating unit 210 according to various embodiments of the present invention will be described in more detail with reference to FIGS. 6 and 7.

Figure 4:
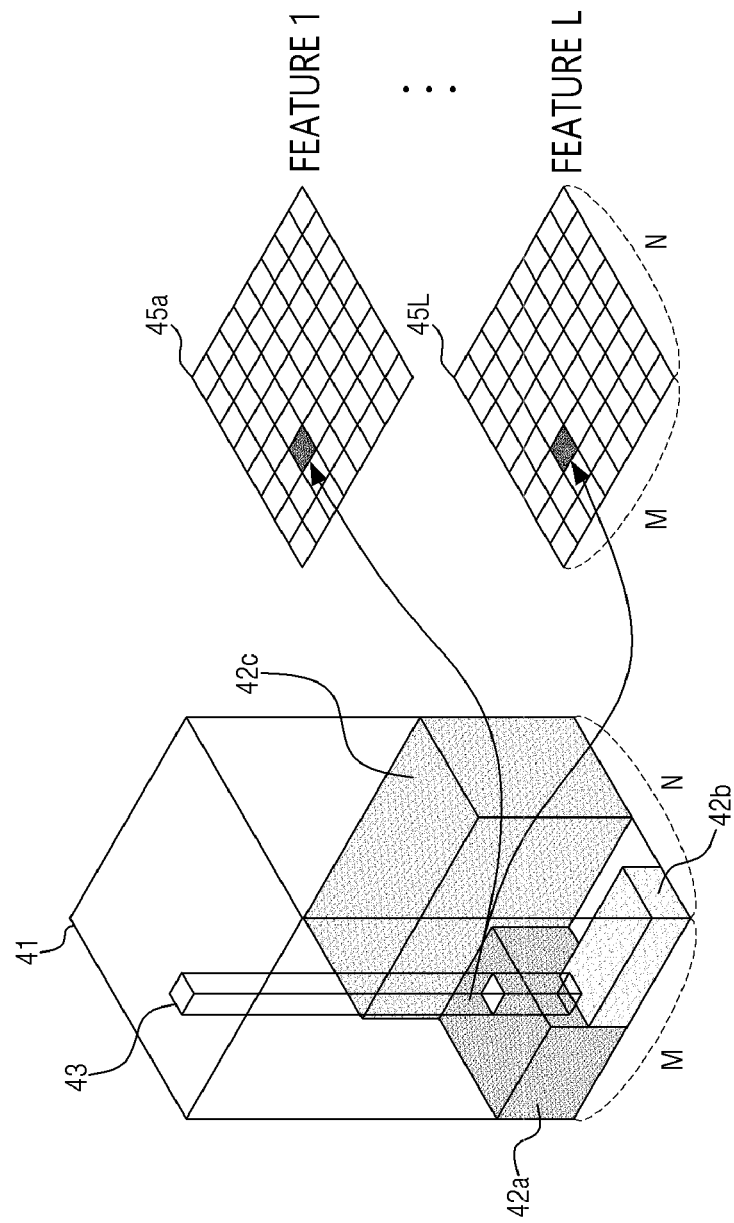
FIGS. 4 to 7 are diagrams for describing features processed in the feature map generating unit of the arrangement state embedding unit described with reference to FIG. 3.

Referring to FIG. 4, the feature maps 45a to 45l generated one for each feature by the feature map generating unit 210 calculating one or more features (e.g., features 1 to L) which represent the state of the objects 42a to 42c arranged in each of the M×N subspaces may be conceptually in the form of a two-dimensional matrix having an M×N size. For example, when the size of a space filled with objects is set to feature 1, the feature map for feature 1 is M×N data consisting of scalar values representing the size of the space filled with objects inside each of the M×N subspaces. Further, when the weight of the arranged object is set to feature 2, the feature map for feature 2 is M×N data consisting of scalar values representing the sum of the weights of the objects arranged inside each of the M×N subspaces.

Figure 5:
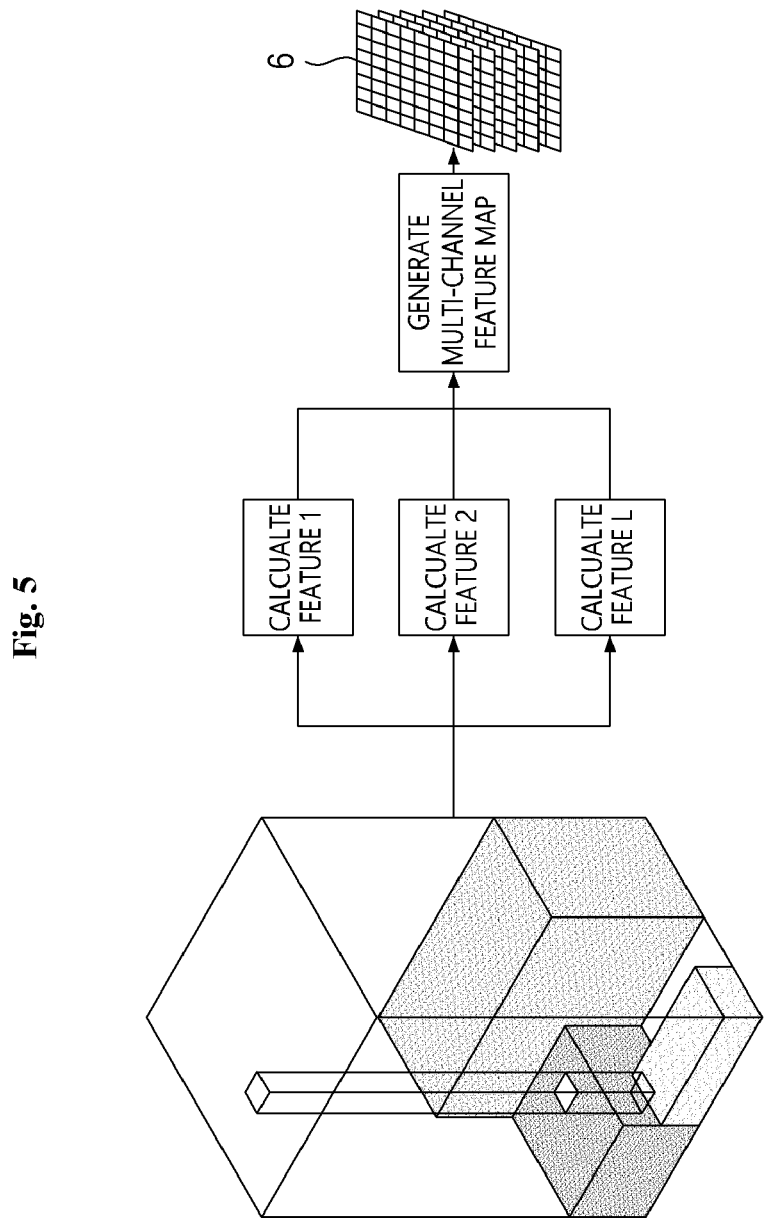

Referring to FIG. 5, the feature map generating unit 210 may merge feature maps 45a to 45l representing respective features calculated from the information 5 on the arrangement state of objects existing in the target space into one multi-channel feature map 6. For example, the feature map generating unit 210 may generate the multi-channel feature map 6 by concatenating data constituting each feature map 45a to 45l.

Hereinafter, various features calculated by the feature map generating unit 210 will be described in more detail with reference to FIGS. 6 and 7.

Figure 6:
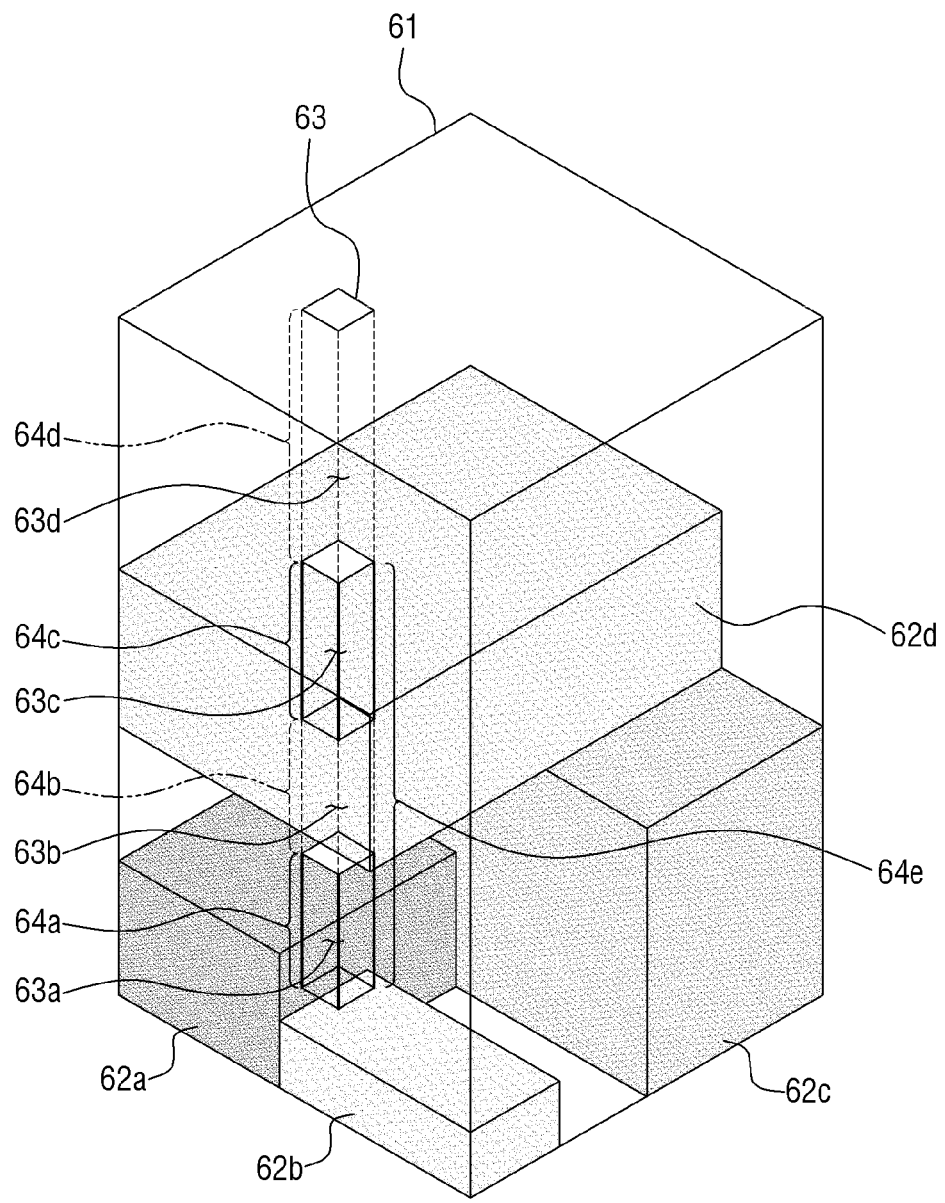

Referring to FIG. 6, as described above, the feature map generating unit 210 calculates various features representing the arrangement state of the objects 62a to 62d existing in the target space 61, and provides them to the feature map vectorization process to be described later. In particular, in various embodiments of the present invention, the target space 61 is divided into M×N square pillar shaped subspaces, and features representing the arrangement state of objects arranged in each subspace 63 are calculated and used.

Various features representing the arrangement state of objects arranged in each subspace may be features representing an occupied state of each subspace. Referring to FIG. 6, the first feature may be the sum of the sizes 64a and 64c of the spaces 63a and 63c filled with the objects 62a and 62d in each subspace 63. The second feature may be the sum of the sizes 64b and 64d of the spaces 63b and 63d that are not filled with objects 62a and 62d in each subspace 63. The third feature is the ratio of the spaces 63b and 63d not filled with objects 62a and 62d compared to the spaces 63a and 63c filled with objects 62a and 62d for each subspace 63 (e.g. (64b+64d) (64a+64c)). The fourth feature may be the number of spaces 63b and 63d that are not filled with the objects 62a and 62d in the subspace 63 (two for the subspace 63). The fifth feature may be the height 64e of the top surface of the objects 62a and 62d arranged in each subspace 63. The sixth feature may be the size of the space 64d above the top surface of the objects 62a and 62d arranged in each subspace. If the arrangement of the target space 61 is completed, the larger the first and fifth features, and the smaller the second to fourth and sixth features, it can be evaluated that the better the arrangement of the objects in the target space 61 was performed.

Further, various features representing the arrangement state of objects arranged in each subspace may be features representing a weight state of each subspace. For example, the seventh feature may be the sum of the weights of objects 62a and 62d arranged within each subspace 63. At this time, it should be noted that the sum of the weights of the objects 62a and 62d arranged in the subspace 63 shown in FIG. 6 does not mean the sum of the total weight of the object 62a and the total weight of the object 62d, but means the sum of the weight of the part 63a arranged in the subspace 63 among the object 62a and the weight of the part 63c arranged in the subspace 63 among the object 62d. The eighth feature can be a weight that can be further arranged within each subspace 63.

Figure 7:
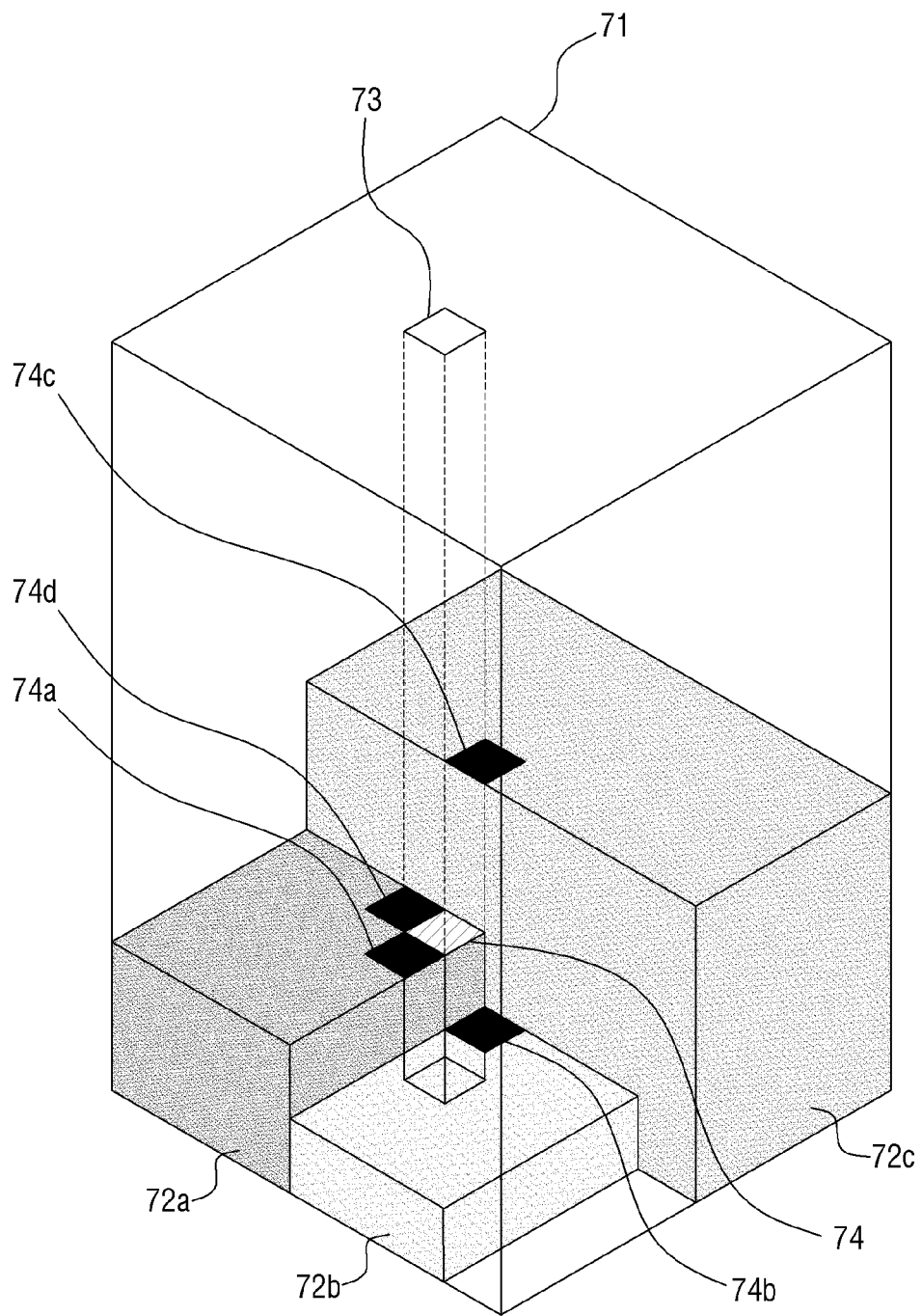

Referring to FIG. 7, various features representing an object arrangement state in each subspace may include a ninth feature representing how uniform is between the height of each subspace that is filled and the height of the adjacent subspace that is filled. Specifically, the ninth feature may be calculated based on the difference between the heights of the top surface of the objects arranged in each subspace and the heights of the top surfaces of the objects arranged in adjacent subspaces. For example, the difference between the height of the top surface 74 of the object 72a arranged in the subspace 73 which is a part of the target space 71 of FIG. 7 and the height of the top surfaces 74a to 74d of the object arranged in the four subspaces adjacent to the subspace 73 can be calculated. If the arrangement of the target space 71 is completed, it can be evaluated that the smaller the difference between the heights of each subspace 73 filled and the height of the adjacent subspaces filled, that is, the more uniform the heights of the parts that are filled with the object within the target space, the more stable the objects are arranged in the target space 71.

The feature map generating unit 210 may generate each feature map using some of the first to ninth features described above, and concatenate them to merge them into one multi-channel feature map 6.

With reference to FIGS. 4 to 7 so far, an exemplary process of the feature map generating unit 210 dividing the lower surface, that is, the bottom surface, among six planes forming the target space 41 having a cuboid shape into M×N subplanes, and then, configuring feature maps 45a to 45l by extracting features for each of the M×N subspaces divided based on the M×N subplanes of the bottom surface has been described.

Hereinafter, with reference to FIGS. 8 and 9, the process of the feature map generating unit 210 according to another embodiment of the present invention generating a feature map by dividing the target space 41 into subspaces based on the front and/or side surfaces of the six planes forming the target space 41 will be described.

Figure 8:
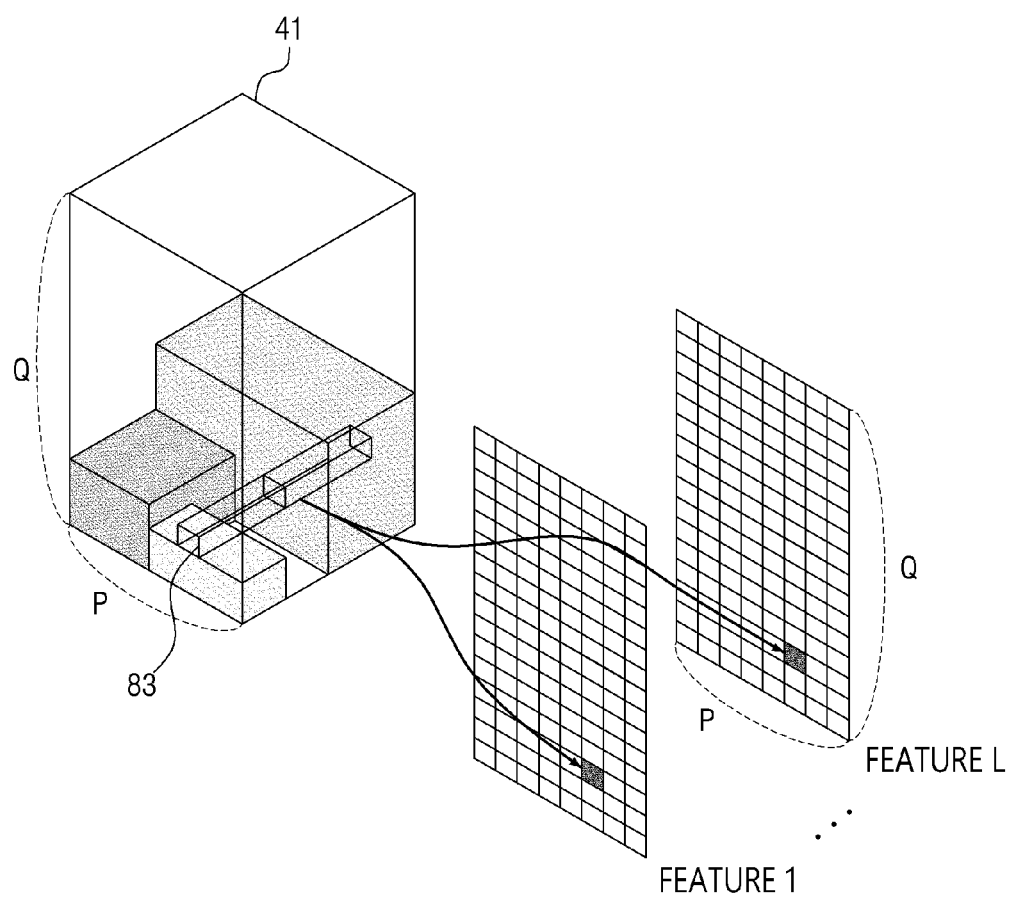
FIGS. 8 and 9 are diagrams for describing other features processed by the feature map generating unit of the arrangement state embedding unit described with reference to FIG. 3.

Referring to FIG. 8, the feature map generating unit 210 may divide the front surface among six planes forming the target space 41 having a cuboid shape into P×Q subplanes, and identify P×Q subspaces 83 extending from each of the P×Q subplanes. That is, the target space 41 may be divided into square pillar shaped P×Q subspaces 83. At this time, a sufficiently large number of P and Q are used.

Figure 9:
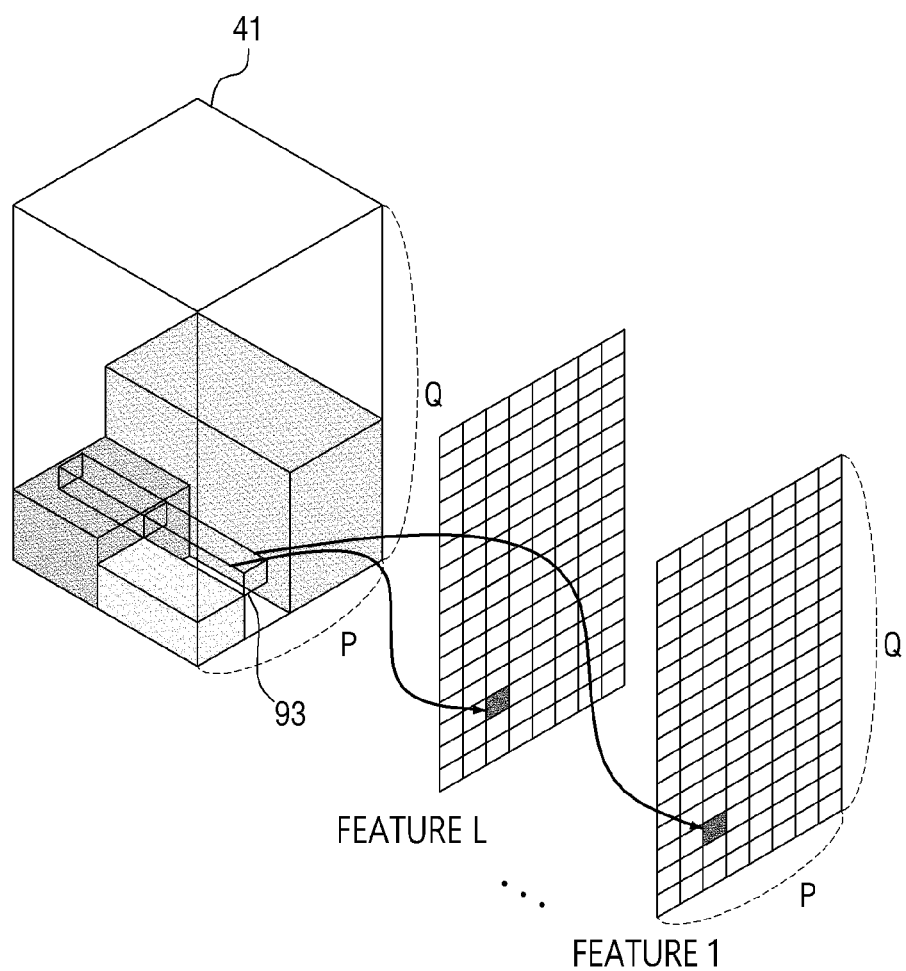

Similarly, referring to FIG. 9, the feature map generating unit 210 may divide the target space 41 into P×Q subspaces 93 based on a side surface among six planes forming the target space 41.

The feature map generating unit 210 calculates features representing the object arrangement state in each subspace for each of P×Q subspaces divided based on the front or side surfaces of the target space 41 to generate feature maps.

The feature of the subspaces divided based on the front or side of the target space 41 may include a tenth feature as to whether an identifier of an object displayed on a part of the surface of the object arranged inside the subspace (for example, a label attached to the surface of the object) is visible from the front or side of the target space 41. For example, in the case where the present embodiment is applied to the process of arranging the loading target boxes in the container loading space, it is preferable to arrange the loading target boxes so that the label attached to the loading target boxes is visible from the outside. Therefore, whether the label attached to a part of the surface of the loading target boxes is visible from the front or side of the container can be considered as one feature appropriately representing the arrangement state of the loading target boxes.

Further, the feature of the subspaces divided based on the front or side of the target space 41 may include the eleventh feature of the shape that the set of objects arranged inside the target space creates when the target space 41 is viewed from the front or the side. When the shape is, for example, a rectangle, of which interior is filled or a triangle having a wide bottom, of which interior is filled, it can be evaluated that the objects are relatively stably arranged. On the other hand, if the shape is an irregular shape, a square, of which interior is empty, or an inverted triangle or an I-shape, it may be evaluated that the objects are relatively unstably arranged.

In this embodiment, the feature map generating unit 210 may use all or part of the feature maps generated with respect to the various features (first through eleventh features) described above based on the bottom, front, and/or side surfaces of the target space 41 to generate a multi-channel feature map 6 and provide it to a feature map vectorization process to be described later.

So far, with reference to FIGS. 4 to 9, the feature map generating unit 210 of the arrangement state embedding unit 200 has been described. Hereinafter, the feature map vectorization unit 220 of the arrangement state embedding unit 200 will be described.

The feature map vectorization unit 220 receives a feature map 6 representing the arrangement state of the target space 41 from the feature map generating unit 210 and generates an embedding vector 7 representing the arrangement state based on the feature map 6. The arrangement state embedding vector 7 generated by the feature map vectorization unit 220 is provided to the object arrangement determination model of the determining unit 300 to be described later together with one or more embedding vectors representing information 1 on the target space and information 2 on the plurality of target objects, and is used for selection of an object to be arranged in a target space and position determination of the object.

The feature map vectorization unit 220 may be configured with an artificial neural network. The artificial neural network constituting the feature map vectorization unit 220 may be an artificial neural network having an autoencoder or variational autoencoder (VAE) structure, or an artificial neural network configured by combining these and other connection layers. However, the feature map vectorization unit 220 of the present invention is not limited to such a structure or form.

Figure 10:
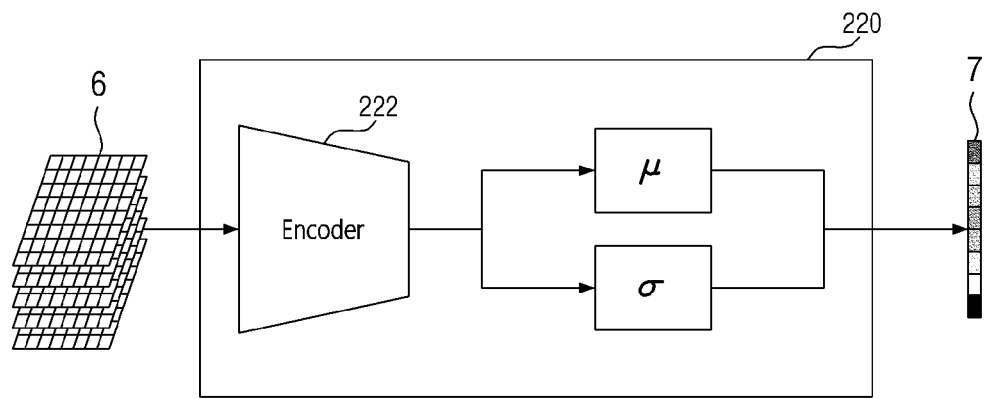
FIG. 10 is a diagram illustrating an exemplary neural network of a feature map vectorization unit of the arrangement state embedding unit described with reference to FIG. 3.

FIG. 10 is a diagram illustrating a feature map vectorization unit 220 configured with an artificial neural network having a variational autoencoder structure according to some embodiments of the present invention. Referring to FIG. 10, the feature map vectorization unit 220 includes a part corresponding to the encoder 222 among artificial neural networks constituting the variational autoencoder.

The encoder 222 of the feature map vectorization unit 220 receives the feature map 6 as input and outputs a latent vector representing the feature map 6. More specifically, the encoder 222 receives data representing the feature map 6 as input, and outputs μ value and σ value defining a probability distribution of a latent space for sampling the latent vector z. The latent vector z is sampled using the output values of μ and G. At this time, the latent vector z is vectorized data that implies the information represented by the feature map 6. The variational autoencoder is learned in advance such that the feature map 6 can be reconfigured as much as possible by the decoder when the latent vector z generated by the encoder 222 that received the feature map 6 is input to a decoder.

Figure 11:
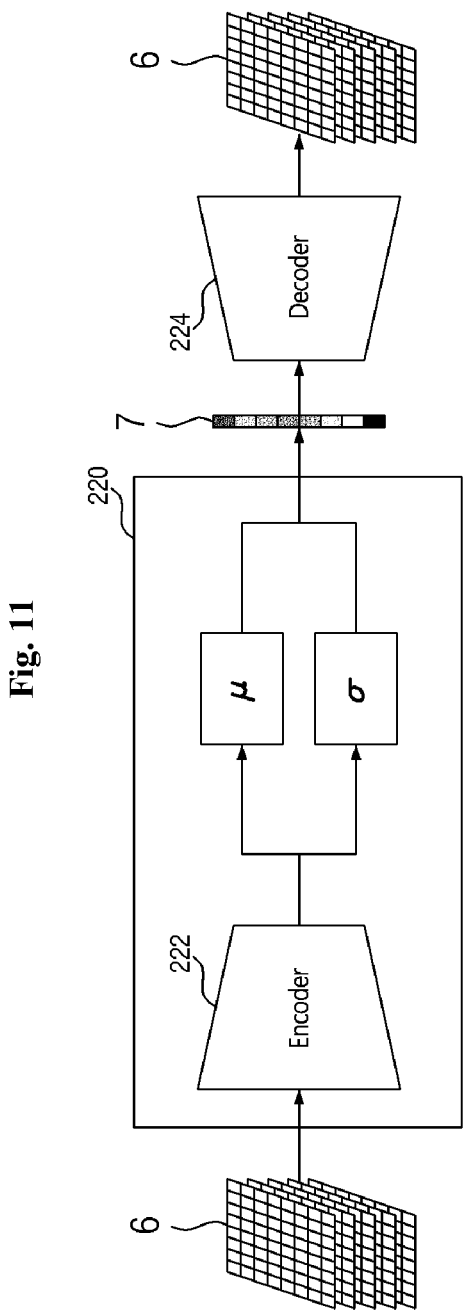
FIG. 11 is a diagram for describing an exemplary method, in which an exemplary neural network of the feature map vectorization unit described with reference to FIG. 10 is learned.

FIG. 11 is a diagram showing the entire structure of the variational autoencoder described with reference to FIG. 10. The variational autoencoder of the feature map vectorization unit 220 may further include a decoder 224 in addition to the encoder 222. The encoder 222 and the decoder 224 of the variational autoencoder may be configured with, for example, a convolutional neural network (CNN) and a fully connected layer. However, it is not limited thereto.

The encoder 222 and the decoder 224 of the variational autoencoder is learned to produce a probability distribution p(z|x) that allows the decoder 224 to restore the original feature map 6 at the best using the latent vector z generated by the encoder 222 embedding from the feature map 6 ($x$). It. In other words, the process of learning the encoder 222 and the decoder 224 is a process, in which the parameters of the artificial neural network constituting the encoder 222 and the decoder 224 are updated in a direction to achieve the above object. In the variational autoencoder, the probability distribution p(z|x) is assumed to approximate a normal distribution, so the latent vector z can be calculated through equation 1 below.

$$z = \mu(x) + \sigma(x) + \epsilon \quad (\epsilon \text{ is the noise value sampled by the normal distribution}) \quad \text{[Equation 1]}$$

As described above, the latent vector z generated by the learned encoder 222 is a vector implicitly expressing the feature map 6 information, and the latent vector z is output as an arrangement state embedding vector 7.

The feature map vectorization unit 220 of the arrangement state embedding unit 200 has been described so far with reference to FIGS. 10 and 11.

As described so far with reference to FIGS. 3 to 11, the arrangement state embedding unit 200 receives the information 5 about the arrangement state of objects existing in the target space as input, and generates the multi-channel feature map 6 by calculating various features representing the arrangement state through the feature map generating unit 210. Further, the arrangement state embedding unit 200 generates arrangement state embedding vector 7 implicitly representing the multi-channel feature map 6 information through the feature map vectorization unit 220. The arrangement state embedding unit 200 provides the arrangement state embedding vector 7 to the object arrangement determining unit 300.

As described so far, an embodiment of the present invention divides a target space into subspaces, and vectorizes features representing a state, in which an object is arranged in each subspace. At this time, arrangement state embedding vector is generated that reflects at least some of the first to sixth features of the occupied state of the subspace, the seventh to eighth features of the weight state of the subspace, and a ninth feature representing how uniform is between the height of each subspace that is filled and the height of adjacent subspace that is filled, the tenth feature as to whether the identifier of the object displayed on a part of the surface of the object arranged inside the subspace is visible from the front or side of the target space, and the eleventh feature of the shape that the set of objects arranged inside the target space creates. That is, it is possible to embed a vector that adequately and sufficiently expresses the state, in which objects are arranged in the target space from various viewpoints.

Hereinafter, the determining unit 300 for determining the arrangement of the object will be described with reference to FIG. 12.

Figure 12:
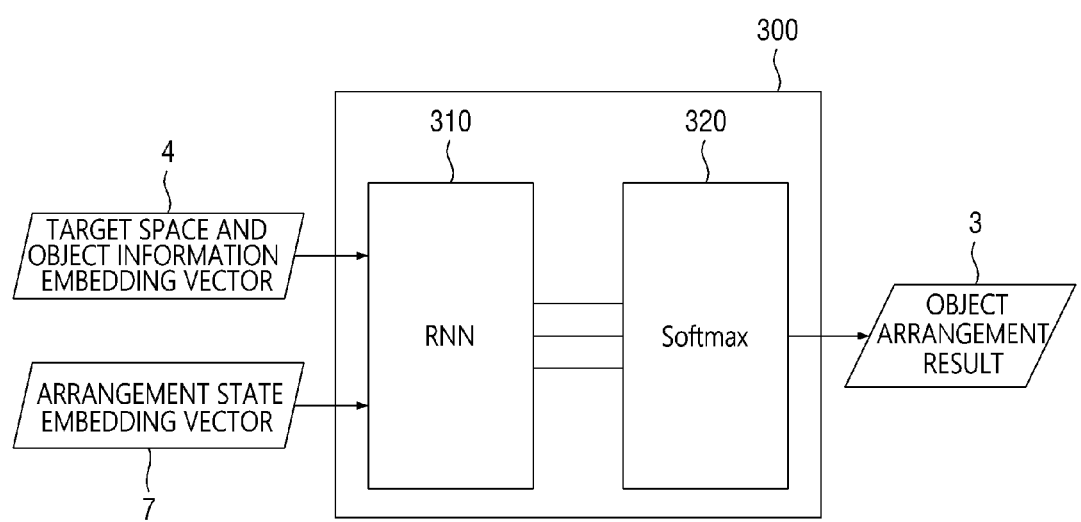
FIG. 12 is an exemplary block diagram illustrating a determining unit of the object arrangement determining apparatus described with reference to FIG. 2.

Referring to FIG. 12, the determining unit 300 receives as input one or more embedding vectors 4 representing information 1 on a target space and information 2 on a plurality of target objects to be arranged in the target space from the input unit 100, and receives as input the current arrangement state embedding vector 7 of the target space from the arrangement state embedding unit 200. The determining unit 300 inputs at least some of the embedding vectors into an object arrangement determination model, and obtains a state, in which at least one object is additionally arranged in a target space, from the model. More specifically, the determining unit 300 selects a first object to be an arrangement target among the plurality of objects, and determines a position in the target space where the first object will be arranged. The determining unit 300 provides the result 3 of the first object being additionally arranged in the target space to the arrangement state update unit 400, and if the arrangement of all possible objects is completed, it outputs the arrangement result as a final result.

Referring to FIG. 12, the object arrangement determination model of the determining unit 300 may be a model based on an artificial neural network. The object arrangement determination model may be configured with, for example, a recurrent neural network (RNN: 310) and a Softmax active function layer 320, but the present invention is not limited to this, and the object arrangement determination model may be configured with various models such as a deep neural network (DNN), a linear neural network (LNN), a long short term memory (LSTM), and a convolutional neural network (CNN), or a combination thereof.

The object arrangement determination model of the determining unit 300 may be learned by the learning unit 600. Specifically, the result of the evaluation (or reward) determined by the arrangement result evaluating unit 500 is provided to the learning unit 600, and the learning unit 600 uses the evaluation result to update the parameters of an artificial neural network constituting an object arrangement determination model.

Specifically, as described above, the object arrangement determination model receives the embedding vectors 4 representing information about the target space and the arrangement target objects and the current arrangement state embedding vector 7, and then selects the next arrangement target object and determines the arrangement position until the arrangement target objects are exhausted. When the arrangement of all objects is completed, the arrangement result 3 is provided to the arrangement result evaluating unit 500 to evaluate the arrangement result 3. The learning objective of the object arrangement determination model is to update the parameters of the artificial neural network constituting the object arrangement determination model so that the evaluated object arrangement evaluation result is the best.

For example, if the input of the object arrangement determination model is referred to as s, the parameter of the object arrangement determination model is referred to as $\theta$, and the evaluation result for the result arranged by parameter $\theta$ for input s is referred to as $J(\theta|s)$, the object arrangement determination model is learned by finding the parameter $\theta$ that makes the value of $J(\theta|s)$ maximum for a given input s.

Various learning theories can be used for learning such an object arrangement determination model. When learning by the policy gradient method, after calculating the gradient by differentiating $J(\theta|s)$ with respect to $\theta$, $\theta$ is updated to increase the size of $J(\theta|s)$ by this value. The gradient for $J(\theta|s)$ can be derived as shown in equation 2 below.

$$\nabla_\theta J(\theta|s) = E_{\pi \sim p_\theta(\cdot|s)}[L(\pi|s) \nabla_\theta \log p_\theta(\pi|s)] \quad \text{[Equation 2]}$$

$L(\pi|s)$: loading quality (reward)
$p_\theta(\pi|s)$: probability of policy selection In equation 2, the policy selection probability refers to the probability of each policy that determines the arrangement target object and the position of the object at a given input (state) s.

The above-described learning method of the object arrangement determination model is only an example of determining the arrangement target object and the arrangement position of the object using the reinforcement learning method, and the present invention is not limited as described above.

Figure 13:
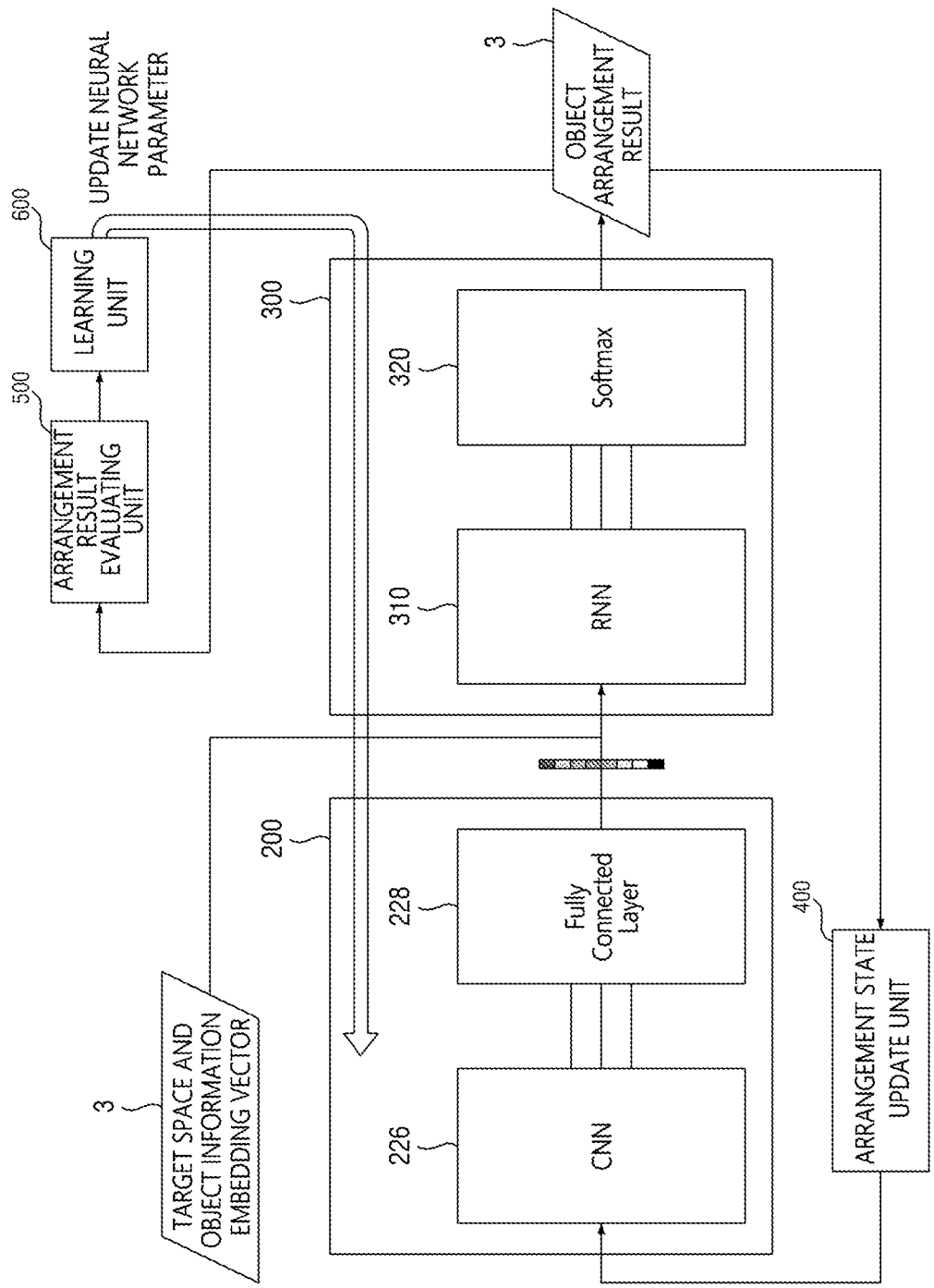
FIG. 13 is a diagram for describing a neural network structure, in which the feature map vectorization unit and the determining unit of the object arrangement determining apparatus described with reference to FIG. 2 can be simultaneously learned.

FIG. 13 is a diagram for describing an example, in which a feature map vectorization unit 220 of an arrangement state embedding unit 200 and an object arrangement determination model of the determining unit 300 are configured to be simultaneously learned in some embodiments of the present invention. For the sake of brevity, the feature map generating unit 210 of the arrangement state embedding unit 200 is not shown in FIG. 13.

In some embodiments, the first artificial neural networks 226 and 228 constituting the feature map vectorization unit 220 and the second artificial neural networks 310 and 320 constituting the object arrangement determination model of the determining unit 300 can be configured to be simultaneously learned through the reinforcement learning process described above. More specifically, the feature map vectorization unit 220 and the determining unit 300 may be implemented as some layers constituting one artificial neural network, instead of being configured as different artificial neural networks. For convenience of description, some layers 226 and 228 corresponding to the feature map vectorization unit 220 are referred to as the first artificial neural network, and some layers 310 and 320 corresponding to the determining unit 300 are referred to as the second artificial neural network. However, it should be noted that the first artificial neural network and the second artificial neural network may be parts of one artificial neural network.

Referring back to FIG. 13, when the feature map vectorization unit 220 and the determining unit 300 are configured to be simultaneously learned, the feature map vectorization unit 220 may be configured with a convolutional neural network 226 and a fully connected layer, and the entire artificial neural network 226, 228, 310, 320 is configured such that the arrangement state embedding vector 7 output by the feature map vectorization unit 220 is provided as an input to the recurrent neural network 310 of the determining unit 300.

As illustrated in FIG. 13, when the feature map vectorization unit 220 and the determining unit 300 are implemented with some layers constituting one artificial neural network, the final arrangement result 3 of all objects is evaluated by the arrangement result evaluating unit 500, the learning unit 600 updates the parameters of the one artificial neural network including the feature map vectorization unit 220 and the determining unit 300 based on the evaluation result, and in this way, the feature map vectorization unit 220 and the determining unit 300 may be simultaneously learned.

So far, the determining unit 300 is described with reference to FIG. 12, and then several embodiments of the present invention, in which an artificial neural network is configured such that the feature map vectorization unit 220 and the determining unit 300 of the arrangement state embedding unit 200 are simultaneously learned, are described with reference to FIG. 13. According to the above embodiments, the harmonized and efficient learning and optimization of the artificial neural networks of the feature map vectorization unit 220 and the determining unit 300 can be possible at the same time, without having to separately learning or optimize them by separate processes.

Hereinafter, the arrangement result evaluating unit 500 will be described with reference to FIG. 14.

The arrangement result evaluating unit 500 receives the result 3 that the arrangement of all objects in the target space is completed as input, and determines evaluation (or reward) for the arrangement result 3. The evaluation result by the arrangement result evaluating unit 500 may be provided to the learning unit 600 as described above and used for learning of the determining unit 300 and the feature map vectorization unit 220.

Evaluation of the arrangement results of objects in the target space may be performed in consideration of various factors. For example, the arrangement results can be evaluated based on, for example, the ratio of the space filled with objects in the target space, the sum of the surface areas of the objects arranged in the target space, and whether the identifier for each of the objects displayed on a part of the surface of each of the objects is visible from the front or side of the target space.

Further, the arrangement result may be evaluated based on a pattern identified from the shape, in which objects are arranged in the target space. In FIG. 14, several arrangement structures or patterns known to stably load objects in a cuboid shaped target space are shown. The arrangement result may be evaluated based on whether the arrangement pattern identified from the results of arranging the objects in the target space is similar to the stable arrangement patterns exemplarily illustrated in FIG. 14 or the degree of similarity.

Further, the result of arranging objects in the target space may be evaluated based on the position of the center of gravity of the target space filled with objects. Specifically, based on the result of filling the objects in the target space, the distance between the position of the center of gravity of the target space and the center point of the target space, and/or the distance between the position of the center of gravity of the target space and the bottom surface of the target space, etc., the stability of the target space filled with objects can be evaluated. For example, when the center of gravity of a container filled with cargo boxes is located at a high position away from the bottom surface of the container, it can be evaluated that the container has poor stability because the risk of falling is high. On the other hand, when the center of gravity of the container is located at a low position close to the bottom surface of the container, it can be evaluated that the container has high stability because the risk of falling is low.

As described so far, the arrangement result evaluating unit 500 according to an embodiment of the present invention, after the arrangement of the object in the target space is completed, evaluates the arrangement results or arrangement quality based on at least some of various evaluation factors such as the ratio that the target space is filled, the sum of the surface areas of the objects arranged in the target space whether the identifier for each of the objects displayed on a part of a surface of each of the objects is visible from the front or side of the target space, the pattern identified from the shape, in which the objects are arranged, and the position of the center of gravity of the target space filled with objects. That is, the embodiments of the present invention provide an improved evaluation of the result of the object being arranged in the target space and allow the above factors to be reflected in learning of the object arrangement determination model by considering evaluation factors that could not be considered in conventional bin packing algorithms based on heuristics.

So far, with reference to FIGS. 1 to 14, the object arrangement determining apparatus 10 according to an embodiment of the present invention has been described. Hereinafter, referring to FIGS. 15 and 16, a method for determining a method of arranging an object in a target space according to another embodiment of the present invention will be described.

Figure 15:
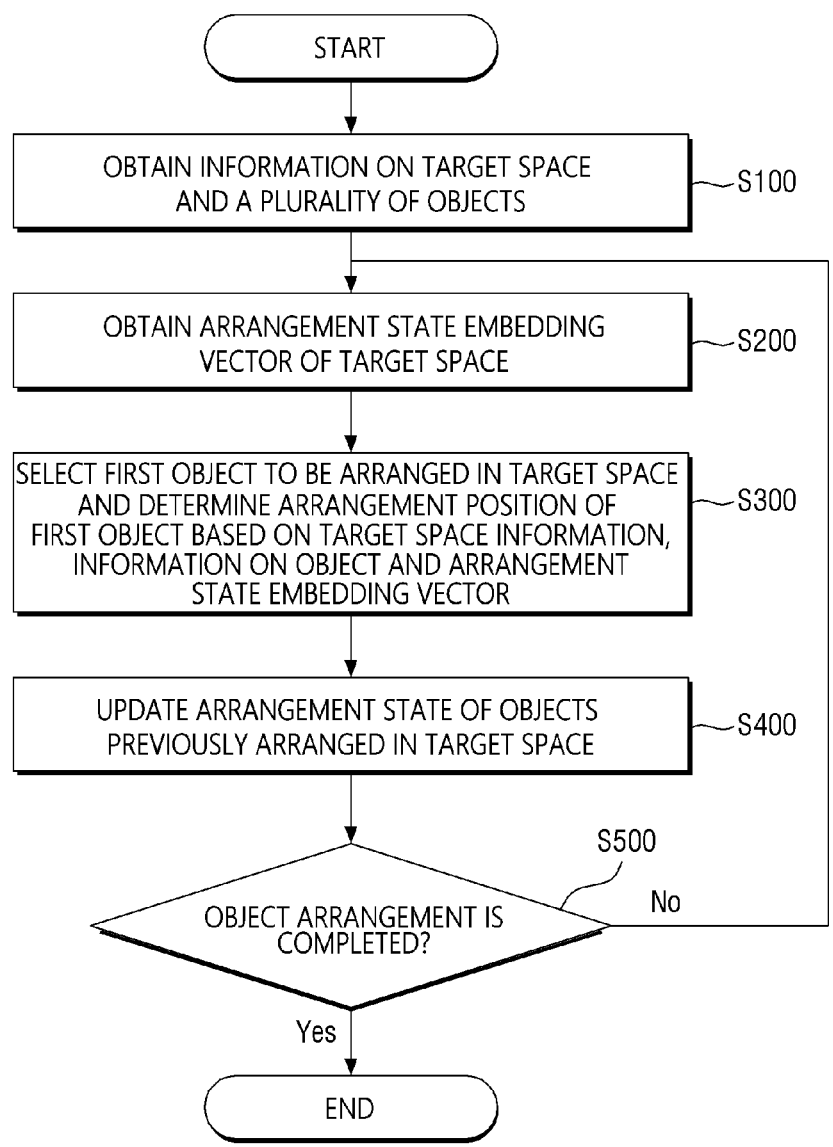
FIG. 15 is a flowchart of a method for arranging objects in a target space according to another embodiment of the present invention.

FIG. 15 is an exemplary flowchart illustrating a series of processes for determining the arrangement of a plurality of objects in a target space according to the present embodiment. However, this is only a preferred embodiment for achieving the object of the present invention, and of course, some steps may be added or deleted as necessary.

Each step of the object arrangement determining method illustrated in FIG. 15 may be performed by a computing device, such as the object arrangement determining apparatus 10. In other words, each step of the object arrangement determining method may be implemented with one or more instructions executed by a processor of a computing device. All steps included in the object arrangement determining method may be performed by one physical computing device, but the first steps of the method may be performed by the first computing device, and the second steps of the method may be performed by the second computing device. Hereinafter, it is assumed that each step of the object arrangement determining method is performed by the object arrangement determining apparatus 10 to continue the description. However, for convenience of description, description of the operation subject of each step included in the object arrangement determining method may be omitted.

Although not separately mentioned, in each operation of the object arrangement determining method according to the present embodiment, the technical spirit of the embodiments described with reference to FIGS. 1 to 14 may be reflected. Conversely, the technical spirit reflected in each operation of the object arrangement determining method according to this embodiment may also be reflected in the configuration and operation of the object arrangement determining apparatus described with reference to FIGS. 1 to 14.

As illustrated in FIG. 15, the method of determining object arrangement according to the present embodiment may include the step of obtaining information on a target space and a plurality of objects (S100), the step of obtaining an arrangement state embedding vector of the target space (S200), the step of selecting a first object to be arranged in the target space and determining an arrangement position of the first object (S300), the step of updating information on the arrangement state of objects existing in the target space by reflecting a result of the first object being arranged (S400) and the step of determining whether object arrangement in the target space is completed (S500).

First, in step S100, information on a target space and a plurality of objects is obtained. Information on the target space and the plurality of objects may be performed, for example, by the input unit 100 of the object arrangement determining apparatus 10. The information on the target space may include information on the shape, size of the target space, and weight that the target space can support, and the information on the plurality of objects may include information on the shape, size, and weight of each object, and the weight that the object can support. According to some embodiments, in step S100, information on a target space and a plurality of objects may be embedded into one or more vectors. For the step S100, the contents described above with respect to the input unit 100 may be further referred to.

In step S200, an arrangement state embedding vector representing an arrangement state of objects existing in the target space is obtained.

Hereinafter, detailed processes of step S200 will be described with reference to FIG. 16. In step S200, feature maps representing features related to an object arrangement state in a subspace are generated for each of a plurality of subspaces constituting a target space, and an arrangement state embedding vector is generated from the feature map.

Figure 16:
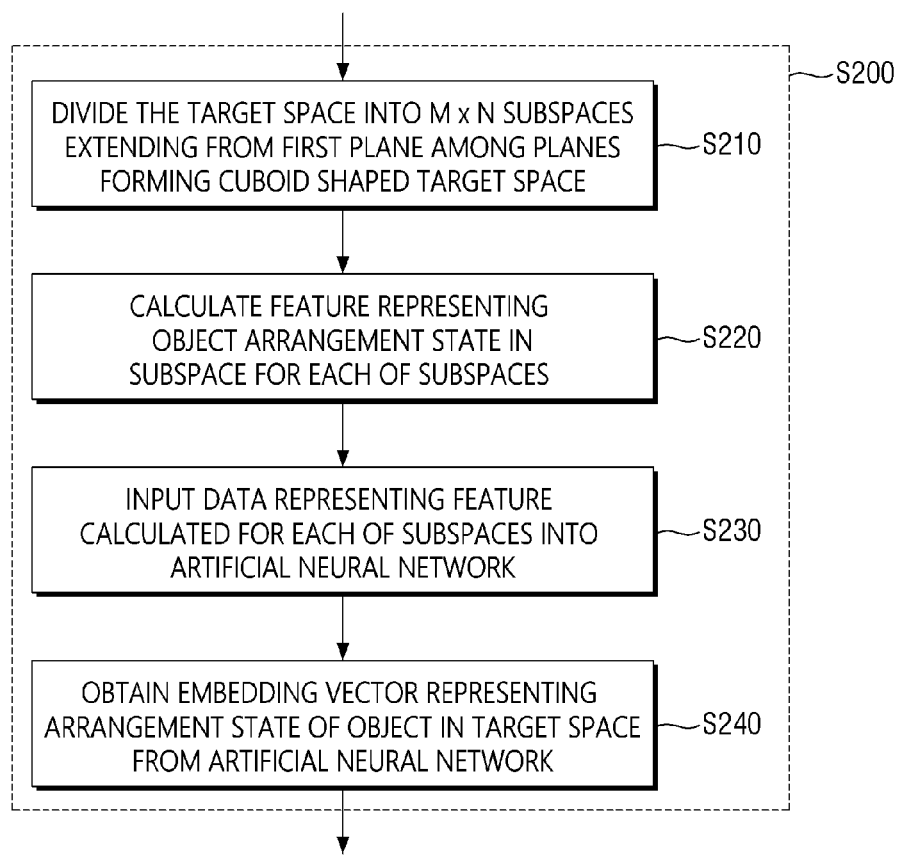
FIG. 16 is a diagram for describing in detail some steps of a method of arranging an object in a target space described with reference to FIG. 15.

Referring to FIG. 16, first, in step S210, a first surface, for example, a bottom surface of six planes forming a target space having, for example, a cuboid shape, is divided into M×N subplanes, and M×N subspaces extending from each of the M×N subplanes are identified. In other words, the target space is divided into M×N subspaces.

In step S220, for each of the subspaces, features representing an object arrangement state in the subspace are calculated.

Here, the features may include features representing the occupied state of each subspace, features representing the weight state of each subspace, and/or features as to how uniform is between the height of each subspace that is filled and the height of the adjacent space that is filled.

Specifically, features representing the object arrangement state in a subspace may include the size of the space filled with objects in each subspace, the size of the space not filled with objects in each subspace, and ratio of the space not filled with objects compared to the space filled with objects, the number of spaces not filled with objects in each subspace, the height of the top surface of the objects arranged in each subspace, the size of the space above the top surface of the objects arranged in each subspace, weights of objects arranged within each subspace, weight that can be added to each subspace, and whether an identifier of an object displayed on a part of the surface of an object arranged within each of the subspaces is visible from the front or side of the target space, and the like.

In step S230, the first data representing features calculated in step S220 for each of the subspaces is input to the first artificial neural network. Here, the first data may be, for example, the feature maps described above with respect to the feature map generating unit 210, and the first artificial neural network may be the encoder 222 neural network described above with respect to the feature map vectorization unit 220.

On the other hand, in some embodiments of the present invention, in step S210, based on the second surface orthogonal to the first surface among the six planes forming the target space, for example, the front or side surface of the target space, the target space can be divided into P×Q subspaces. In step S220, features related to the state of the object arranged in the P×Q subspaces are additionally calculated, and in step S230, the second data representing the features of the P×Q subspaces divided based on the second surface may be input to the first artificial neural network together with the first data.

In step S240, an arrangement state embedding vector implicitly representing the arrangement state of the object in the target space is obtained from the first artificial neural network.

With respect to steps S210 to S240, the contents described above with respect to the arrangement state embedding unit 200 can be further referred to.

It will be described again with reference to FIG. 15.

In step S300, based at least in part on the information on the target space and the plurality of objects obtained in step S100, and/or the arrangement state embedding vector obtained in step S200, a first object will be arranged in the target space among the plurality of objects is selected and a position where the first object will be arranged in the target space is determined. In some embodiments, in step S300, information on a plurality of objects and an arrangement state embedding vector are input to the second artificial neural network, and the first object and the arrangement position of the first object are determined by the second input neural network.

In some embodiments, the first artificial neural network and the second artificial neural network may be artificial neural networks that are separately learned. In some other embodiments, the first artificial neural network and the second artificial neural network are some layers constituting one artificial neural network, and may be configured to be simultaneously learned through one learning process.

For the step S300, the contents described above with respect to the determining unit 300 may be further referred to.

In step S400, the arrangement state information of objects existing in the target space is updated by reflecting the result of the first object being arranged in the target space in step S300. Step S400 may be performed, for example, by the arrangement state update unit 400 of the object arrangement determining apparatus 10.

In step S500, it is determined whether the arrangement of the object in the target space is completed. If all of the plurality of objects identified in step S100 have already been arranged in the target space, or if there are no more arrangeable objects in consideration of the size and weight of the target space, it can be determined that the arrangement of the objects in the target space is completed. If it is determined in step S500 that the arrangement of the object is not completed, returning to step S200, steps S200 to S500 are repeatedly performed. If it is determined in step S500 that the arrangement of the object is completed, the object arrangement determining method ends, and the current arrangement state may be provided as a final arrangement result.

So far, referring to FIGS. 1 to 16, an apparatus and method for determining an object arrangement according to some embodiments of the present invention and its application fields are described. Hereinafter, an exemplary computing device 1500 capable of implementing the object arrangement determining apparatus 10 according to some embodiments of the present invention will be described.

Figure 17:
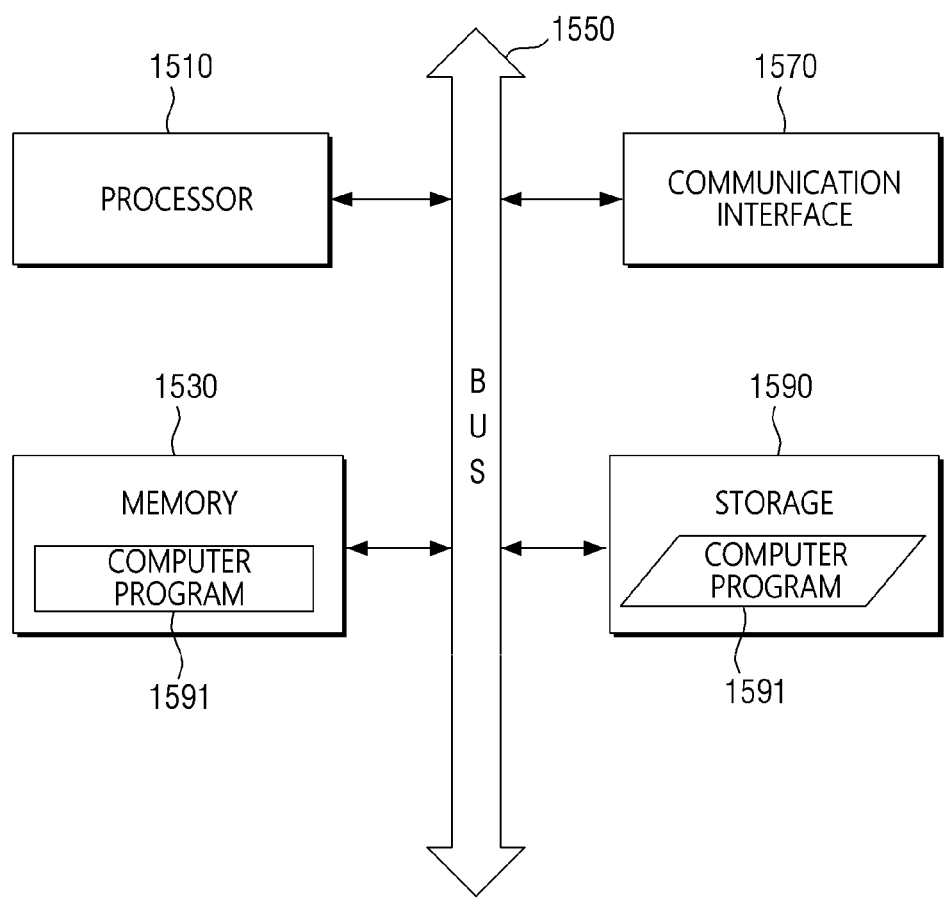
FIG. 17 is a diagram illustrating an exemplary computing device capable of implementing an object arrangement determining apparatus according to some embodiments of the present invention.

FIG. 17 is a diagram illustrating an exemplary computing device 1500 capable of implementing an object arrangement determining apparatus 10 according to some embodiments of the present invention.

As shown in FIG. 17, the computing device 1500 may include one or more processors 1510, a bus 1550, a communication interface 1570, a memory 1530, which loads a computer program 1591 executed by the processors 1510, and a storage 1590 for storing the computer program 1591. However, FIG. 17 illustrates only the components related to the embodiment of the present disclosure. Therefore, it will be appreciated by those skilled in the art that the present disclosure may further include other general purpose components in addition to the components shown in FIG. 17.

The processor 1510 controls overall operations of each component of the computing device 1500. The processor 1510 may be configured to include at least one of a Central Processing Unit (CPU), a Micro Processor Unit (MPU), a Micro Controller Unit (MCU), a Graphics Processing Unit (GPU), or any type of processor well known in the art. Further, the processor 1510 may perform calculations on at least one application or program for executing a method/operation according to various embodiments of the present disclosure. The computing device 1500 may have one or more processors.

The memory 1530 stores various data, instructions and/or information. The memory 1530 may load one or more programs 1591 from the storage 1590 to execute methods/operations according to various embodiments of the present disclosure. For example, when the computer program 1591 is loaded into the memory 1530, method according to embodiments of the present disclosure may be implemented on the memory 1530. An example of the memory 1530 may be a RAM, but is not limited thereto.

The bus 1550 provides communication between components of the computing device 1500. The bus 1550 may be implemented as various types of bus such as an address bus, a data bus and a control bus.

The communication interface 1570 supports wired and wireless internet communication of the computing device 1500. The communication interface 1570 may support various communication methods other than internet communication. To this end, the communication interface 1570 may be configured to include a communication module well known in the art of the present disclosure.

The storage 1590 can non-temporarily store one or more computer programs 1591. The storage 1590 may be configured to include a non-volatile memory, such as a Read Only Memory (ROM), an Erasable Programmable ROM (EPROM), an Electrically Erasable Programmable ROM (EEPROM), a flash memory, a hard disk, a removable disk, or any type of computer readable recording medium well known in the art.

The computer program 1591 may include one or more instructions, on which the methods/operations according to various embodiments of the present disclosure are implemented. When the computer program 1591 is loaded on the memory 1530, the processor 1510 may perform the methods/operations in accordance with various embodiments of the present disclosure by executing the one or more instructions.

In the above case, the object arrangement determining apparatus 10 according to some embodiments of the present invention may be implemented through the computing device 1500.

So far, various embodiments of the present invention and effects according to the embodiments are described with reference to FIGS. 1 to 17. Effects according to the technical sprit of the present invention are not limited to the above-mentioned effects, and other effects not mentioned will be clearly understood by those skilled in the art from the following description.

The technical features of the present disclosure described so far may be embodied as computer readable codes on a computer readable medium. The computer readable medium may be, for example, a removable recording medium (CD, DVD, Blu-ray disc, USB storage device, removable hard disk) or a fixed recording medium (ROM, RAM, computer equipped hard disk). The computer program recorded on the computer readable medium may be transmitted to other computing device via a network such as internet and installed in the other computing device, thereby being used in the other computing device.

In the above description, it is described that all the components constituting the embodiments of the present disclosure are combined or operated as one, but the technical features of the present disclosure are not limited to these embodiments. That is, within the scope of the present disclosure, all of the components may be selectively combined and operated in one or more combinations.

Although the operations are shown in a specific order in the drawings, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation. The scope of protection of the present invention should be interpreted by the following claims, and all technical ideas within the scope equivalent thereto should be construed as being included in the scope of the technical idea defined by the present disclosure.

What is claimed is:

1. A method of embedding a vector representing an arrangement state of objects in a 3D space, the method comprising:
dividing a target space into M×N subspaces extending from a first surface among planes forming the target space having a cuboid shape;
calculating, for each of the subspaces, a feature representing an object arrangement state in the subspace;
inputting data representing the feature of each of the subspaces into an artificial neural network;
obtaining, from the artificial neural network, an embedding vector representing an arrangement state of an object in the target space; and
dividing the target space into P×Q subspaces extending from a second surface orthogonal to the first surface among planes forming the target space,
wherein calculating a feature representing a state of an object arranged in the subspace comprises calculating a feature for each of subspaces extending from the second surface, and
wherein inputting data representing the feature into an artificial neural network comprises inputting data representing a feature of each of the subspaces extending from the second surface into the artificial neural network.

2. The method of embedding a vector representing an arrangement state of objects in a 3D space of claim 1,
wherein dividing the target space into M×N subspaces extending from the first surface comprises,
dividing the first plane into M×N subplanes; and
identifying each space between an opposing surface of the first surface and the M×N subplanes as M×N subspaces extending from the first surface.

3. The method of embedding a vector representing an arrangement state of objects in a 3D space of claim 1,
wherein the first surface is a bottom surface of the target space, and
wherein a feature representing an object arrangement state in the subspace represents an occupancy state of each of the subspaces.

4. The method of embedding a vector representing an arrangement state of objects in a 3D space of claim 3,
wherein the occupancy state of each of the subspaces includes the number of spaces not occupied with the object in each of the subspaces.

5. The method of embedding a vector representing an arrangement state of objects in a 3D space of claim 3,
wherein the occupancy state of each of the subspaces includes at least one of a size of space occupied with the object in each of the subspaces, a size of space not occupied with the object in each of the subspaces, a ratio of the space not occupied with the object compared to the space occupied with the object, a height of a top surface of the object arranged in each of the subspaces, and a size of space above a top surface of the object arranged in each of the subspaces.

6. The method of embedding a vector representing an arrangement state of objects in a 3D space of claim 1,
wherein the first surface is a bottom surface of the target space, and
wherein a feature representing an object arrangement state in the subspace includes at least one of a weight of the object arranged in each of the subspaces and a weight that can be added to each of the subspaces.

7. The method of embedding a vector representing an arrangement state of objects in a 3D space of claim 1,
wherein the first surface is a bottom surface of the target space, and
wherein a feature representing an object arrangement state in the subspace includes a difference between a height of a top surface of the object arranged in each of the subspaces and a height of a top surface of the object arranged in an adjacent subspace of each of the subspaces.

8. The method of embedding a vector representing an arrangement state of objects in a 3D space of claim 1,
wherein the second surface is a front or side surface of the target space, and
wherein a feature for each of subspaces extending from the second surface includes whether an identifier of the object displayed on a surface of an object arranged in each of the subspaces extending from the second surface is visible from the second surface.

9. A method of arranging an object in a 3D space, the method comprising:
obtaining information on a target space having a pre-existing object and information on a plurality of objects to be arranged in the target space;
obtaining an arrangement state embedding vector of the target space according to the method of claim 1; and
selecting, based on the information on the target space, the information on the plurality of objects and the embedding vector, a first object to be arranged in the target space among the plurality of objects and determining a position where the first object will be arranged in the target space.

10. The method of arranging an object in a 3D space of claim 9,
wherein information on the target space and the plurality of objects includes information on a size of the target space and information on a size of each of the plurality of objects.

11. The method of arranging an object in a 3D space of claim 10,
wherein information on the target space and the plurality of objects further includes information on a weight that can be supported by a bottom surface of the target space and information on a weight of each of the plurality of objects.

12. The method of arranging an object in a 3D space of claim 9,
wherein obtaining the embedding vector comprises,
inputting data representing the feature of each of the subspaces into a first artificial neural network; and
obtaining the embedding vector from the first artificial neural network.

13. The method of arranging an object in a 3D space of claim 12,
wherein selecting a first object to be arranged in the target space among the plurality of objects and determining a position where the first object will be arranged in the target space comprises inputting information on the plurality of objects and the embedding vector into a second artificial neural network.

14. An apparatus for determining an arrangement of an object in a 3D space, the apparatus comprising:
an input unit for obtaining information on a target space and a plurality of objects to be arranged in the target space;
an embedding unit for obtaining an arrangement state embedding vector of the target space from information on arrangement state of objects existing in the target space;
a determining unit for selecting a first object to be arranged in the target space among the plurality of objects and determining a position where the first object will be arranged in the target space based on information on the target space, information on the plurality of objects and the embedding vector; and
an arrangement state update unit for updating information on an arrangement state of objects existing in the target space;
wherein the embedding unit is configured to:
divide the target space into M×N subspaces extending from a first surface among planes forming the target space having a cuboid shape;
calculate, for each of the subspaces, a feature representing an object arrangement state in the subspace;

input data representing the feature of each of the subspaces into an artificial neural network; and obtain, from the artificial neural network, the arrangement state embedding vector in the target space.

15. The apparatus for determining an arrangement of an object in a 3D space of claim 14, wherein the embedding unit includes a feature map generating unit and a feature map vectorization unit, wherein the feature map generating unit generates a feature map representing a feature representing an object arrangement state in the subspace for each of the plurality of subspaces, into which the target space is divided, wherein the feature map vectorization unit inputs the feature map into a first artificial neural network and obtains the embedding vector from the first artificial neural network, and wherein the determining unit inputs information on the plurality of objects and the embedding vector into a second artificial neural network and obtains a position where the first object will be arranged from the second artificial neural network.

16. The apparatus for determining an arrangement of an object in a 3D space of claim 15, further comprising, an arrangement result evaluating unit and learning unit, wherein the arrangement result evaluating unit generates an evaluation result for a result that the plurality of objects are arranged in the target space, and wherein the learning unit updates parameters of the first artificial neural network and the second artificial neural network based on the evaluation result.

17. The apparatus for determining an arrangement of an object in a 3D space of claim 16, wherein the evaluation result includes whether an identifier for each of the objects displayed on a part of a surface of each of the plurality of objects is visible.

18. The apparatus for determining an arrangement of an object in a 3D space of claim 16, wherein the evaluation result includes a position of a center of gravity of the target space filled with the plurality of objects.

19. The apparatus for determining an arrangement of an object in a 3D space of claim 16, wherein the evaluation result includes a pattern made by the plurality of objects arranged in the target space.

* * * * *